United States Patent
Yanamoto

(10) Patent No.: US 6,822,272 B2
(45) Date of Patent: Nov. 23, 2004

(54) MULTILAYERED REFLECTIVE MEMBRANE AND GALLIUM NITRIDE-BASED LIGHT EMITTING ELEMENT

(75) Inventor: Tomoya Yanamoto, Anan (JP)

(73) Assignee: Nichia Corporation, Tokushima (JP)

( * ) Notice: Subject to any disclaimer, the term of this patent is extended or adjusted under 35 U.S.C. 154(b) by 0 days.

(21) Appl. No.: 10/189,767

(22) Filed: Jul. 8, 2002

(65) Prior Publication Data

US 2003/0047744 A1 Mar. 13, 2003

(30) Foreign Application Priority Data

Jul. 9, 2001 (JP) .................................... P2001-207680

(51) Int. Cl.⁷ ................ H01L 31/0328; H01L 31/0336; H01L 31/072
(52) U.S. Cl. .......................... 257/189; 257/11; 257/13; 257/79; 257/103
(58) Field of Search ........................... 257/11, 13, 189, 257/79–103; 372/39, 44–46

(56) References Cited

U.S. PATENT DOCUMENTS

| 5,889,806 A | * | 3/1999 | Nagai et al. | 372/45 |
| 6,249,534 B1 | * | 6/2001 | Itoh et al. | 372/49 |
| 6,252,894 B1 | * | 6/2001 | Sasanuma et al. | 372/45 |
| 6,597,716 B1 | * | 7/2003 | Takatani | 372/46 |
| 2003/0047744 A1 | * | 3/2003 | Yanamoto | 257/98 |

FOREIGN PATENT DOCUMENTS

| JP | 6-5916 A | 1/1994 |
| JP | 6-45650 A | 2/1994 |
| JP | 7-226535 A | 8/1995 |
| JP | 8-70139 A | 3/1996 |
| JP | 8-228048 A | 9/1996 |
| JP | 11-191658 A | 7/1999 |
| JP | 11-220173 A | 8/1999 |
| JP | 2000-49410 A | 2/2000 |
| JP | 2001-7444 A | 1/2001 |
| JP | 2001-284645 A | 10/2001 |

OTHER PUBLICATIONS

Li et al., Genetic algorithm for design of reflective filters: application to AlGaN based Bragg reflectors, 2000, Proceedings of SPIE, vol. 4094, pp. 129–136.*

Khan et al., Reflective filters based on single-crystal GaN/AlGaN multilayers deposited using low pressure metalorganic chemical vapor deposition, 1991, American Institute of Physics, 1449–1451.*

Waldrip et al., Stress engineering during metalorganic chemical vapor deposition of AlGaN/GaN distributed Bragg reflectors, 2001, American Institute of Physics, 3205–3207.*

Fernandez et al., High quality distributed Bragg reflectors based on AlGaN/GaN multilayrs grown by molecular beam epitaxy, 2001, American Institute of Physics, 2136–2138.*

Nikishin et al., Gas source molecular beam epitaxy of high quality AlGaN on Si, 2001, 1409–1412.*

* cited by examiner

Primary Examiner—Mary Wilczewski
Assistant Examiner—Monica Lewis
(74) Attorney, Agent, or Firm—Nixon & Vanderhye PC

(57) ABSTRACT

A gallium nitride-based multilayered reflective membrane with an excellent crystallinity while keeping a high reflectivity and a gallium nitride-based light emitting element using such a multilayered reflective are provided. The multilayered reflective membrane includes an $Al_aGa_{1-a}N$ layer ($0<a<1$) having a thickness of $(\alpha_1 \cdot \lambda)/(4n_1)$ ($\lambda$: incident light wavelength, $n_1$: a reflectivity) and a GaN layer having a thickness of $(\alpha_2 \cdot \lambda)/(4n_2)$ ($n_2$: a reflectivity) which are deposited alternately and satisfy the relationship of $0<\alpha_1<1$ and $\alpha_1+\alpha_2=2$.

16 Claims, 9 Drawing Sheets

MULTILAYERED REFLECTIVE MEMBRANE AND GALLIUM NITRIDE-BASED LIGHT EMITTING ELEMENT

FIELD OF THE INVENTION

The present invention relates to a light emitting element such as laser diode element (LD), a light emitting diode element (LED) and the like comprising a nitride semiconductor ($In_xAl_yGa_{1-x-y}N$, $0 \leq X$, $0 \leq Y$, $X+Y \leq 1$).

DESCRIPTION OF THE RELATED ART

Since a multilayered reflective membrane layer formed by alternately depositing two layers with different reflectivities has an extremely high reflectivity, the layer is used in a variety of purposes. Such a multilayered reflective membrane layer is generally formed by depositing pairs of a first layer with a film thickness of $\lambda/4n_a$ ($\lambda$: incident light wavelength, and $n_a$: index of refraction) and a second layer with a film thickness of $\lambda/4n_b$ [$\lambda$: incident light wavelength, and $n_b$: index of refraction ($n_b \neq n_a$)] and in order to obtain a further high reflectivity, the reflectivity difference of the first layer and the second layer is required to be large.

For example, in the case of forming a multilayered reflective membrane using $Al_aGa_{1-a}N$ ($0<a<1$) for the above first layer and GaN for the second layer, in order to make the reflectivity difference between these layers wide, the Al mixed crystal ratio a of the $Al_aGa_{1-a}N$ is required to be high.

As a light emitting element using such a multilayered reflective membrane, applicant of the present invention has developed a short wavelength laser oscillating in a violet to green region as disclosed in Japanese Laid-open Patent Publication No. 2001-7444. A schematic cross-sectional view of the laser element is illustrated in FIG. 7. The laser element 10 of FIG. 7 is a surface emitting laser element and formed by depositing an n-type nitride semiconductor layer, an active layer 6 composed of $In_xGa_{1-x}N$ ($0<x<1$) and a p-type nitride semiconductor layer in this order on a sapphire substrate 1 through a buffer layer 2. In the laser element 10, the n-type nitride semiconductor layer is composed of an n-type contact layer 3, a second n-type clad layer 4, an n-type multilayered reflective membrane 44, and a first n-type clad layer 5 formed on the buffer layer 2. On the other hand, the p-type nitride semiconductor layer formed on the active layer 6 is composed of a second p-type clad layer 7, a first p-type clad layer 8, and a p-type contact layer 9. Further, a negative electrode is formed on the n-type contact layer 3 and a positive electrode is formed on the p-type contact layer 9.

In such a laser element 10, the multilayered reflective membrane 44 is formed in the n-type nitride semiconductor layer nearer to the substrate 1 side than the active layer 6. The multilayered reflective membrane 44 functions as a mirror (light reflecting) layer and reflects the emitted light from the active layer 6 and enclosed it in the active layer 6. In the laser element 10 of FIG. 7, the multilayered reflective membrane 44 is formed by alternately depositing, for example, each 10 layers of $Al_aGa_{1-a}N$ ($0<a<1$) and GaN.

SUMMARY OF THE INVENTION

In a multilayered reflective membrane comprising $Al_aGa_{1-a}N$ and GaN, if the Al mixed crystal ratio a of the $Al_aGa_{1-a}N$ layer is increased in order to increase the reflectivity difference between these layers, as a is increased, the crystallinity of the $Al_aGa_{1-a}N$ layers is deteriorated. If multilayered reflective membrane with deteriorated crystallinity is formed in a laser element 10, there occurs a problem that the light emitted from an active layer 6 is diffused in the multilayered reflective membrane 44 and the multilayered reflective membrane 44 cannot sufficiently exhibit the function as the reflective membrane to result in increase of the threshold electric current value and the threshold voltage for laser oscillation.

Further, in the laser element 10, if the crystallinity of the multilayered reflective membrane 44 is low, there is a problem that the crystallinity of the respective nitride semiconductor layers to be grown on the multilayered reflective membrane 44 is deteriorated and morphological abnormality takes place and cracks are formed.

On the other hand, if the Al mixed crystal ratio a is lowered in order to suppress the crystallinity deterioration of the $Al_aGa_{1-a}N$ layer, the reflectivity difference between the $Al_aGa_{1-a}N$ layer and the GaN layer becomes small and the reflectivity of the multilayered reflective membrane is decreased. If the multilayered reflective membrane with a low reflectivity is formed in the laser element 10, the light cannot effectively be enclosed in the active layer 6 to result in difficulty of laser oscillation.

The present invention is to solve the above-described problems and to provide a gallium nitride-based multilayered reflective membrane with an excellent crystallinity while keeping a high reflectivity and a gallium nitride-based light emitting element using such a multilayered reflective membrane.

A multilayered reflective membrane of the present invention includes an $Al_aGa_{1-a}N$ layer ($0<a<1$) having a thickness of $(\alpha_1 \cdot \lambda)/(4n_1)$ ($\lambda$: incident light wavelength, $n_1$: index of refraction) and a GaN layer having a thickness of $(\alpha_2 \cdot \lambda)/(4n_2)$ ($n_2$: index of refraction) which are deposited alternately and satisfy the relationship of $0<\alpha_1<1$ and $\alpha_1+\alpha_2=2$.

Conventionally, in a multilayered reflective membrane depositing a plurality of pairs of an $Al_aGa_{1-a}N$ layer and a GaN layer, the film thickness of the $Al_aGa_{1-a}N$ layer and the film thickness of the GaN layer composing one pair are $\lambda/4n_1$ (that is, $\alpha_1=1$) and $\lambda/4n_2$ (that is, $\alpha_2=1$), respectively. Whereas, according to the present invention, while keeping $\alpha_1+\alpha_2=2$ as it is before, $\alpha_1$ is kept less than 1 to make the film thickness of the $Al_aGa_{1-a}N$ layer thinner than the conventional value $\lambda/4n_1$, so that a multilayered reflective membrane with an excellent crystallinity while keeping a high reflectivity can be obtained. Further, since the $Al_aGa_{1-a}N$ layer is made thinner than before, even if the Al mixed crystal ratio a is made relatively high, the crystallinity deterioration can be suppressed and a multilayered reflective membrane with a high reflectivity can be obtained.

In such a multilayered reflective membrane, the Al mixed crystal ratio a of the $Al_aGa_{1-a}N$ layer is preferable to satisfy $0.2 \leq a \leq 0.8$. It is because if a exceeds 0.8, the crystallinity deterioration of the multilayered reflective membrane probably becomes significant, whereas if a is less than 0.2, the reflectivity difference between the $Al_aGa_{1-a}N$ layer and the GaN layer becomes small and it probably becomes difficult to obtain the multilayered reflective membrane with a sufficient reflectivity. The Al mixed crystal ratio a is more preferable to satisfy $0.3 \leq a \leq 0.7$ and in such a case, it is made possible to obtain a remarkably high reflectivity difference and excellent crystallinity.

Further, in the above-described multilayered reflective membrane, $\alpha_1$ has preferably a value of not greater than 0.75. It is because if $\alpha_1$ exceeds 0.75, the film thickness of the $Al_aGa_{1-a}N$ layer becomes too thick and the crystallinity deterioration of the multilayered reflective membrane probably becomes significant. More preferably, a satisfies the relation of $\alpha_1 \leq 0.5$ and in such a case, the film thickness of the $Al_aGa_{1-a}N$ layer becomes sufficiently thin and the crystallinity of the multilayered reflective membrane becomes extremely excellent.

The multilayered reflective membrane as described above is suitable to be used for a gallium nitride-based light emitting element having an active layer of $In_xGa_{1-x}N$ ($0 \leq x < 1$). Hereinafter, the gallium nitride-based light emitting element of the present invention will be described. The gallium nitride-based light emitting element of the present invention has a multilayered reflective membrane formed on a substrate, said multilayered reflective membrane being deposited on at least one side of an active layer composed of $In_xGa_{1-x}N$ ($0 \leq x < 1$) through a nitride semiconductor layer.

Further, the multilayered reflective membrane may be formed between the active layer and the substrate. Furthermore, the light emitting element of the present invention may be formed by depositing an n-type clad layer, an active layer composed of $In_xGa_{1-x}N$ ($0 \leq x < 1$), and a p-type clad layer in the order and include the multilayered reflective membrane between the substrate and the active layer. Such a gallium nitride-based light emitting element has a multilayered reflective membrane with a high crystallinity and a high reflectivity between the substrate and the active layer, so that the crystallinity deterioration of the respective nitride semiconductor layers to be deposited on the multilayered reflective membrane can be suppressed and crack formation and occurrence of morphological abnormality can be prevented and the threshold current value and the threshold voltage value of the light emitting element can be lowered.

Further, the nitride semiconductor layer formed between the substrate and the active layer may be a superlattice layer. Since the superlattice layer has a low electric conductivity, the efficiency of carrier injection to the active layer can be improved, thereby further lowering the threshold current value and the threshold voltage value of the light emitting element. Furthermore, the superlattice layer may be formed so as to contact directly with the multilayered reflective membrane, and further the superlattice layer may be formed so as to contact directly with the active layer, thereby further improving the efficiency of carrier injection.

Further, such a gallium nitride-based light emitting element of the present invention is preferable to be employed for a surface emitting type laser element that emits light in the perpendicular direction to the main surface of a substrate.

BRIEF DESCRIPTION OF THE DRAWINGS

The above and other objectives and features of the present invention will become more apparent from the following description of preferred embodiments thereof with references to the accompanying drawings, throughout which like parts are designated by like reference numerals.

DETAILED DESCRIPTION OF THE PREFERRED EMBODIMENTS

The present disclosure relates to subject matter contained in application No.2001-207680 filed Jul. 9, 2001 in Japan, the content of which is incorporated hereinto by reference.

Figure 1A:
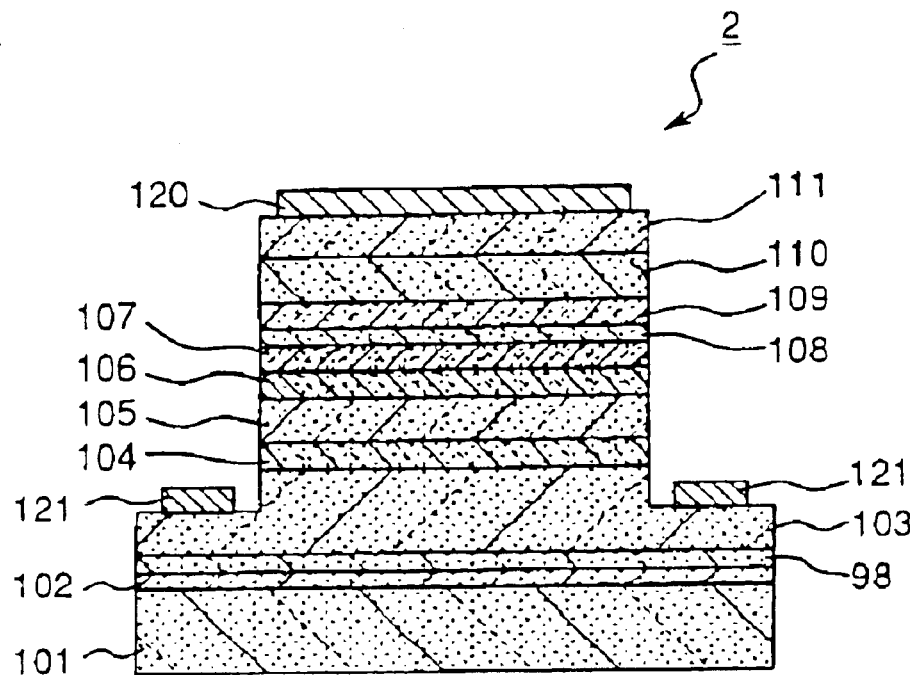
FIG. 1A shows a cross-sectional view illustrating one example of a GaN-based light emitting element relevant to the invention and FIG. 1B is an enlarged cross-sectional view of the multilayered reflective membrane included in the light emitting element of FIG. 1A.

FIG. 1A is a cross-sectional view illustrating one example of a GaN-based light emitting element according to the present invention, which has an active layer composed of $In_xGa_{1-x}N$ ($0 \leq x < 1$). The GaN-based light emitting element of FIG. 1A is a surface emitting type GaN-based laser element and emits light in the perpendicular direction to the main surface of the substrate. The semiconductor laser element 2 has so-called double hetero structure in which an active layer 107 composed of $In_xGa_{1-x}N$ ($0 \leq x < 1$) is sandwiched between n-type $Al_yGa_{1-y}N$ ($0 \leq y < 1$) layers (values for y differ in respective layers) 103 to 106 and p-type $Al_zGa_{1-z}N$ ($0 \leq z < 1$) layers (values for z differ in respective layers) 108 to 111 on a GaN substrate 101 and has a multilayered reflective membrane 98 between the active layer 107 and the substrate 101.

Figure 1B:
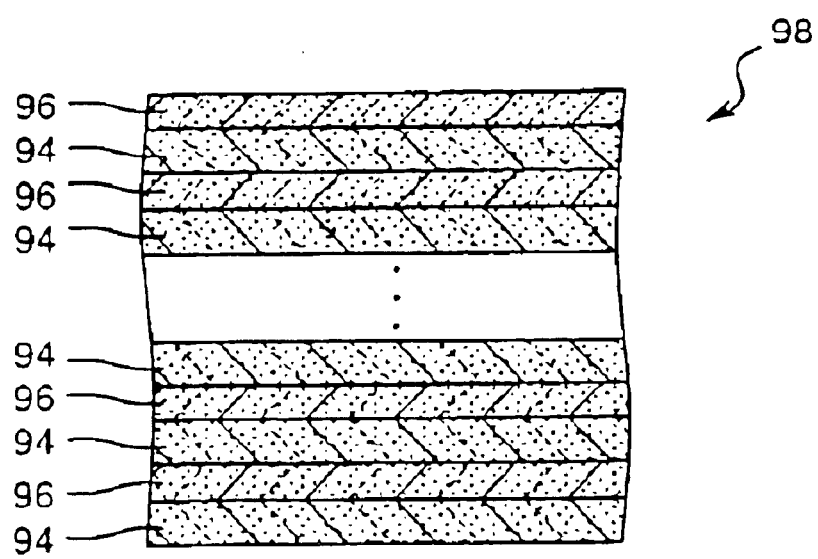

The nitride semiconductor laser element 2 of FIG. 1A comprises a multilayered reflective membrane 98 between, for example, a buffer layer 102 and an n-type contact layer 103 (both of which will be described later). The multilayered reflective membrane 98, as illustrated in FIG. 1B, comprises an $Al_aGa_{1-a}N$ ($0 < a < 1$) layer with a film thickness of $(\alpha_1 \cdot \lambda)/(4n_1)$ and a GaN layer with a film thickness of $(\alpha_2 \cdot \lambda)/(4n_2)$ which are alternately deposited and satisfies $0 < \alpha_1 < 1$ and $\alpha_1 + \alpha_2 = 2$. Incidentally, the reference character $\lambda$ denotes the incident light wavelength, $n_1$ denotes the index of refraction of the $Al_aGa_{1-a}N$, and $n_2$ denotes the index of refraction of GaN.

In a conventional multilayered reflective membrane, as described above with the reference to FIG. 7, the film thickness of an $Al_aGa_{1-a}N$ layer and the film thickness of a GaN layer composing one pair are $\lambda/4n_1$ (that is $\alpha_1 = 1$) and $\lambda/4n_2$ (that is $\alpha_2 = 1$), respectively. With such a conventional multilayered reflective membrane, since the crystallinity of the $Al_aGa_{1-a}N$ layer is low, it is difficult to simultaneously achieve a high reflectivity and an excellent crystallinity. The inventors of the present invention have found that in the case $\alpha_1 + \alpha_2 = 2$ is kept as before, even if the film thickness of the $Al_aGa_{1-a}N$ layer is made thinner than $\lambda/4n_1$ ($\alpha_1 < 1$) and the film thickness of the GaN layer is made thicker than $\lambda/4n_2$ ($\alpha_2 < 1$), a high reflectivity can be retained and moreover, the wavelength selectivity for a reflectivity is rather increased. As described above, the $Al_aGa_{1-a}N$ layer can be thinned by setting the film thickness of the $Al_aGa_{1-a}N$ layer to be less than $\lambda/4n_1$, so that the crystallinity can be improved while a high reflectivity being kept high.

Figure 2:
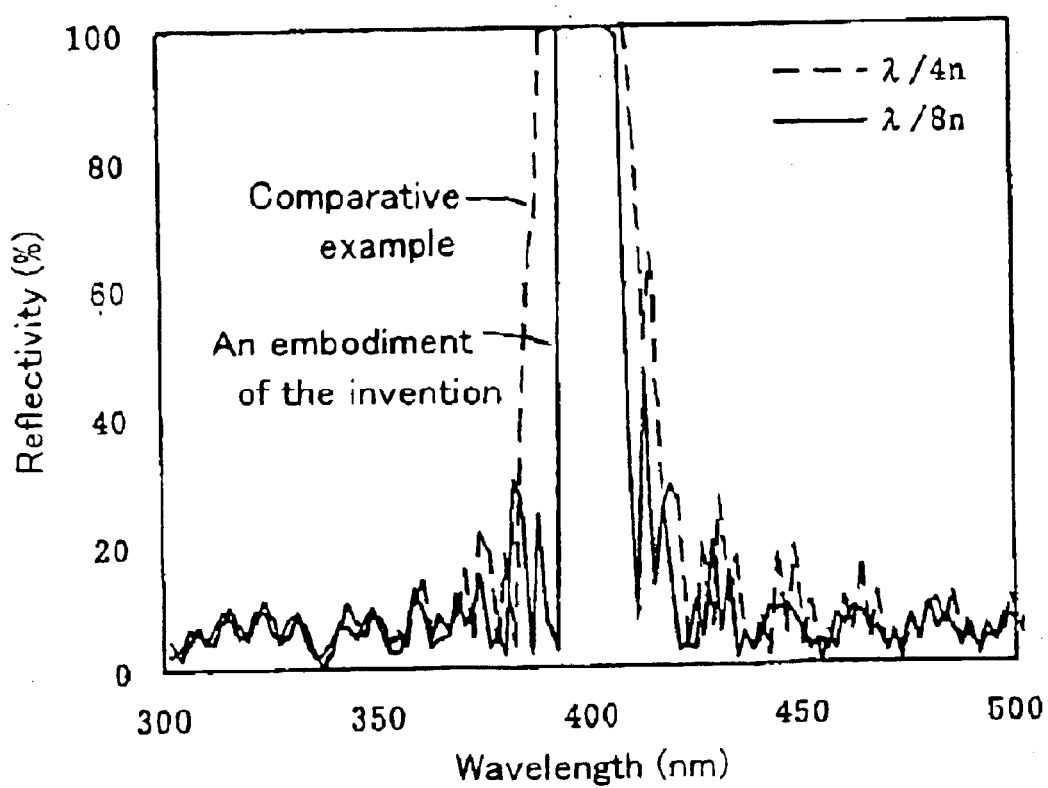
FIG. 2 shows a graph showing the wavelength dependency (the theoretical value) of the reflectivity of the multilayered reflective membrane of an embodiment of the invention.

FIG. 2 is a graph showing the wavelength dependency (the theoretical value) of the reflectivity of the multilayered reflective membrane 98 of the present embodiment. The multilayered reflective membrane 98 is formed by alternately depositing each 100 layers of an $Al_{0.5}Ga_{0.5}N$ layer with a film thickness of $\lambda/8n_1$ (that is, if $\alpha_1=\frac{1}{2}$ and $\lambda=400$ nm, the index of refraction $n_1$ of $Al_{0.5}Ga_{0.5}N$ satisfies=2.05) and a GaN layer with a film thickness of $3\lambda/8n_2$ (that is, if $\alpha_2=\frac{3}{2}$ and $\lambda=400$ nm, the refractive index $n_1$ of GaN satisfies =2.5). Only for comparison, the wavelength dependency (theoretical value) of the multilayered reflective membrane formed by alternately depositing each 100 layers of an $Al_{0.5}Ga_{0.5}N$ layer with a film thickness of $\lambda/4n_1$ and a GaN layer with a film thickness of $\lambda/4n_2$ is also shown. As apparent from FIG. 2, the multilayered reflective membrane of the present embodiment is found capable of improving the reflection effect in the selective wavelength region more than the comparative one while keeping the peak intensity of the reflectivity as high as the comparative one. Incidentally, the data shown in FIG. 2 is all theoretical values and the deterioration of the reflectivity following the deterioration of the crystallinity or the like is not taken into consideration. Accordingly, in actual, the reflectivity of the multilayered reflective membrane of the comparative example is supposed to considerably decrease because of light absorption and diffusion owing to the deterioration of the crystallinity.

Figure 3:
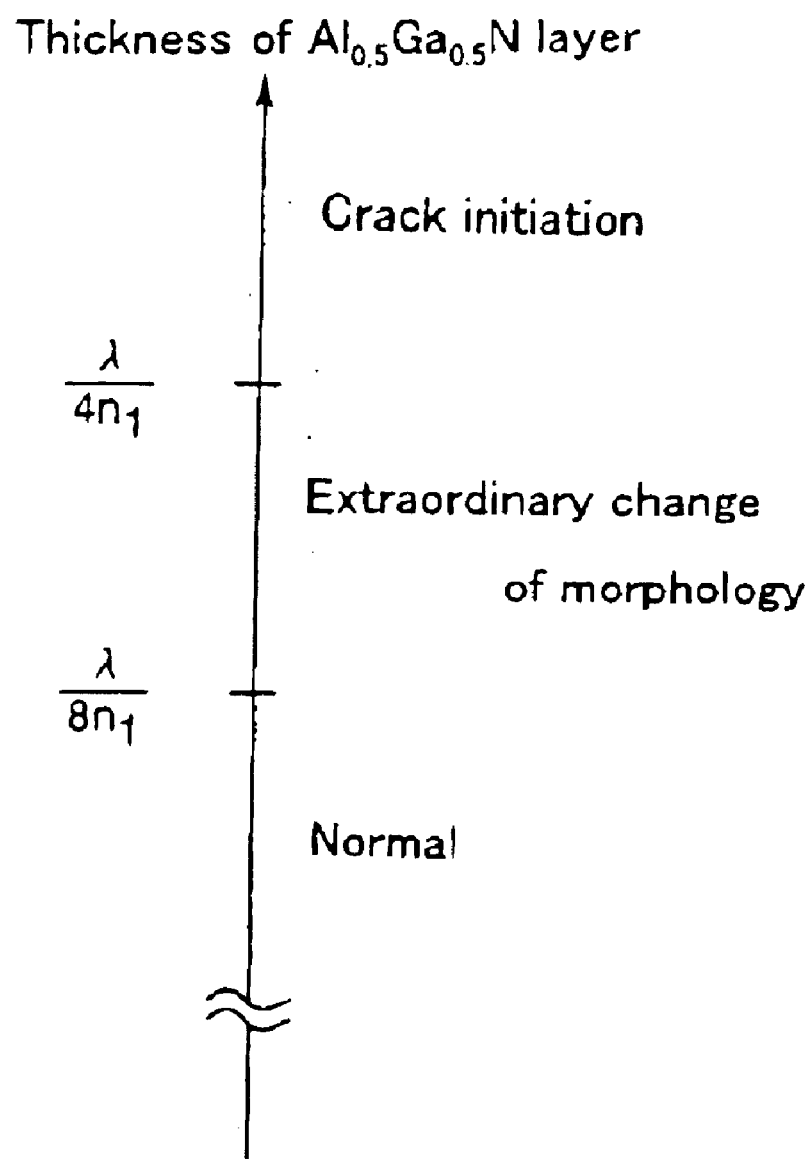
FIG. 3 shows an illustration showing the relationship of the film thickness of an $Al_{0.5}Ga_{0.5}N$ layer and surface morphology of the $Al_{0.5}Ga_{0.5}N$ layer.

Next, the relationship between the film thickness of an $Al_aGa_{1-a}N$ layer and the surface morphology will be described. FIG. 3 shows the relationship between the film thickness of the $Al_{0.5}Ga_{0.5}N$ layer and the surface morphology of the $Al_{0.5}Ga_{0.5}N$ layer in the case the $Al_{0.5}Ga_{0.5}N$ layer is formed on the GaN layer. As shown in FIG. 3, up to $\lambda/8n_1$ of the film thickness, the surface morphology of the $Al_{0.5}Ga_{0.5}N$ layer is normal, but if exceeding $\lambda/8n_1$, morphological abnormality is observed owing to the deterioration of the crystallinity and if exceeding $\lambda/4n_1$, crack formation is observed. Such a relationship of the film thickness and the surface morphology depends on the Al mixed crystal ratio a of an $Al_aGa_{1-a}N$ layer and the higher the mixed crystal ratio a, the more the threshold film thickness with which the morphological abnormality or surface morphological abnormality such as cracks is observed is shifted to the thin side. In the case another nitride semiconductor layer is deposited on an $Al_aGa_{1-a}N$ layer in which morphological abnormality or crack formation takes place owing to deterioration of the crystallinity, there occurs a problem that the deterioration of the crystallinity of the $Al_aGa_{1-a}N$ layer is transmitted to the deposited nitride semiconductor layer. Accordingly, it can be understood that in order to produce the multilayered reflective membrane with a high crystallinity, the film thickness of the $Al_aGa_{1-a}N$ layer is preferable to be kept less than $\lambda/4n_1$. Further, if the film thickness of the $Al_aGa_{1-a}N$ layer is thin, the reflectivity tends to be lowered, it is more preferable to keep the film thickness $\lambda/8n_1$.

In the multilayered reflective membrane 98 of the present invention, while keeping $\alpha_1+\alpha_2=2$ as it is in a conventional one and keeping a high reflectivity of the multilayered reflective membrane, the $Al_aGa_{1-a}N$ layer whose crystallinity is easy to be deteriorated can be made thin by keeping $\alpha_1$ as $\alpha_1<1$. Accordingly, the multilayered reflective membrane with excellent crystallinity and a high reflectivity can be obtained. Further, since the $Al_aGa_{1-a}N$ layer can be made thin, even if the Al mixed crystal ratio a is relatively increased, the crystallinity deterioration can be suppressed and the multilayered reflective membrane with a further high reflectivity can be obtained. Further, since the multilayered reflective membrane 98 with excellent crystallinity can be produced, the crystallinity deterioration of the respective nitride semiconductor layers to be deposited on the multilayered reflective membrane 98 can be suppressed and crack formation and morphological abnormality can be prevented. Further, in the case where such a multilayered reflective membrane is used as a light emitting element, the threshold current value and the threshold voltage value can be lowered.

The Al mixed crystal ratio a of the $Al_aGa_{1-a}N$ layer is preferably $0.2 \leq a \leq 0.8$, more preferably $0.3 \leq a \leq 0.7$. It is because if a exceeds 0.8, the crystallinity of the $Al_aGa_{1-a}N$ layer probably becomes significant and if a is less than 0.2, the reflectivity difference between the $Al_aGa_{1-a}N$ layer and the GaN layer becomes small and it probably results in difficulty of obtaining the multilayered reflective membrane with a sufficiently high reflectivity. In the case a satisfied $0.3 \leq a \leq 0.7$, it is made possible to obtain an extremely high reflectivity difference and excellent crystallinity.

Further, $\alpha_1$ is preferably $\alpha_1 \leq 0.75$ and more preferably $\alpha_1 \leq 0.5$. It is because if $\alpha_1$ exceeds 0.75, the film thickness of the $Al_aGa_{1-a}N$ layer becomes too thick and the crystallinity deterioration of the $Al_aGa_{1-a}N$ layer probably becomes significant and if $\alpha_1$ satisfies $\alpha_1 \leq 0.5$, the film thickness of the $Al_aGa_{1-a}N$ layer is sufficiently thin and the crystallinity of the $Al_aGa_{1-a}N$ layer becomes extremely excellent.

Taking the fact that if the number of the pairs of the deposited layers is too high, the quantity of the light absorbed by the multilayered reflective membrane 98 increases accordingly into consideration, the number of the pairs of the deposited layers of the multilayered reflective membrane 98 is about 50 to 200. If the number of the pairs of the deposited layers is within the foregoing range, the crystallinity and the reflectivity of the multilayered reflective membrane 98 can efficiently be improved. Further, the multilayered reflective membrane 98 may be doped with n-type impurities such as Si, Ge in a concentration range of $1 \times 10^{18}/cm^3$ to $1 \times 10^{21}/cm^3$. Either the $Al_aGa_{1-a}N$ layer or the GaN layer may be doped with an n-type impurity or both may be doped. Doping of the multilayered reflective membrane layer 98 with an n-type impurity decreases the resistance value of the multilayered reflective membrane layer 98 and consequently, the $V_f$ of a laser element can be decreased. However, doping of the multilayered reflective membrane layer 98 with the n-type impurity tends to decrease the crystallinity of the multilayered reflective membrane 98 and in the case nitride semiconductor layers are deposited on the multilayered reflective membrane 98 with decreased crystallinity, the decrease of the crystallinity of the multilayered reflective membrane 98 is transmitted to the respective nitride semiconductor layers on the multilayered reflective membrane 98 to decrease the crystallinity of the respective layers. Accordingly, in the case of doping the multilayered reflective membrane 98 with an n-type impurity, it is preferable to form the multilayered reflective membrane 98 at a position away from a substrate 101, that is, near to an active layer 107, so as to decrease the number of the nitride semiconductor layers to be deposited on the multilayered reflective membrane 98. Consequently, a laser element with high crystallinity can be produced.

The multilayered reflective membrane 98 illustrated in FIG. 1B is so formed as to have an $Al_aGa_{1-a}N$ layer 94 at the beginning and a GaN layer 96 at the end, however the multilayered reflective membrane 98 of the present invention is not limited in the depositing order of the $Al_aGa_{1-a}N$ layer 94 and the GaN layer 96, and the similar effect can be obtained in the case of depositing in the order as the $Al_aGa_{1-a}N$ layer 94, the GaN layer 96, the $Al_aGa_{1-a}N$ layer 94 . . . the $Al_aGa_{1-a}N$ layer 94 and the GaN layer 96 from the substrate 101 side or in the order as the GaN layer 96, the $Al_aGa_{1-a}N$ layer 94, the GaN layer 96 . . . the GaN layer 96, and the $Al_aGa_{1-a}N$ layer 94 from the substrate 101 side. However, in the case the multilayered reflective membrane 98 is formed by depositing in the order of the GaN layer 96, the $Al_aGa_{1-a}N$ layer 94 . . . the GaN layer 96 and $Al_aGa_{1-a}N$ layer 94 from the substrate 101 side and a contact layer 103 having a similar composition to that of the $Al_aGa_{1-a}N$ layer 94 is formed in contact with the $Al_aGa_{1-a}N$ layer 94, the $Al_aGa_{1-a}N$ layer 94 in the upper most layer (the remotest layer from the substrate 101) of the multilayered membrane 98 cannot function as the reflection (mirror) layer. Accordingly, the depositing order of the multilayered reflective membrane 98 is preferable to be properly selected so as to exhibit the effect as a reflection layer of the multilayered reflective membrane 98 to the farthest extent while taking the composition of another nitride semiconductor layer which is in contact with the multilayered reflective membrane 98 into consideration.

In the laser element 2 illustrated in FIG. 1A, the multilayered reflective membrane 98 is formed between a buffer layer 102 and an n-type contact layer 103, however the depositing position of the multilayered reflective membrane 98 of the laser element 2 of the present invention is not particularly limited to that. It is proper if the multilayered reflective membrane is deposited between the active layer and the substrate through the nitride semiconductor layer. The multilayered reflective membrane is preferably formed so as to contact directly with the nitride semiconductor layer that contacts directly with the active layer, thereby lowering the threshold current value of the laser element.

Further, the multilayered reflective membrane 98 is more preferable to be formed also in a p-type nitride semiconductor layer of the active layer 107 side on the opposite to the substrate 101 side. The reason for that is as follows. In the n-type nitride semiconductor layer, for example, a p-type contact layer 111 and an air layer have a relatively high reflectivity difference. Accordingly, in the p-type nitride semiconductor layer, the light emitted from the active layer 107 can be reflected by the p-type contact layer 111 and turned back to the active layer 107 to enclose the light. However, since the multilayered reflective membrane 98 of the present invention has an extremely high reflectivity as described above, if the 98 is formed also in the p-type nitride semiconductor layer, the light enclosing effect in the active layer 107 is further improved. Incidentally, the depositing position of the multilayered reflective membrane 98 in the p-type nitride semiconductor layer is not particularly limited, however in the case doping of the multilayered reflective membrane 98 with a p-type impurity is carried out, the multilayered reflective membrane 98 is preferable to be formed in the p-type nitride semiconductor layer at a position as remote as possible from the active layer 107. It is because the crystallinity of the multilayered reflective membrane 98 tends to be decreased by the doping of the multilayered reflective membrane 98 with the p-type impurity.

Further, the nitride semiconductor layer between the active layer 107 and the multilayered reflective membrane 98 is preferably a superlattice layer, more preferably the superlattice layer is formed so as to contact directly with the multilayered reflective membrane 98. The superlattice layer includes a deposited unit layers, the each unit layer having the thickness of about less than 100 Å which corresponds to the thickness of some atomic layers, and has a maximum thickness of 200 Å for one pair. On the other hand, as previously mentioned, the multilayered reflective membrane of the present invention can be thinned down to $\lambda/8n_1$, in such a case, film thickness of $Al_{0.5}Ga_{0.5}N$ layer and GaN with a film thickness 3 $\lambda/8n_2$ are 243 Å and 600 Å, respectively, thereby obtaining a film thickness of 843 Å for a pair of the multilayered reflective membrane. Accordingly, since the thickness of the each pair of the superlattice layers is smaller than that of the multilayered reflective membranes, the superlattice layers does not work as a mirror. Consequently, deterioration of the optical reflectivity of the element can be suppressed. Further, since the superlattice layer can increase the carrier mobility in the crosswise direction against the resonance direction of light, the carrier can be effectively injected into a high reflective region, specially in the case of the surface emitting type semiconductor laser having the high reflective region. Further, also in the resonance direction of light, the carrier can be effectively injected into the active layer by the tunnel effect of the superlattice layer. Further, the thickness of the superlattice layer and the active layer, which are sandwiched by the multilayered reflective membrane, can be adjusted so as to form a standing wave. It is preferable to form the active layer so as to exist at the position of the loop of the standing wave.

Further, a dielectric multilayered membrane may be formed in the p-type nitride semiconductor layer side of the active layer 107 on the opposite to the substrate 101 side. For example, two or more layers of a layer of $SiO_2/TiO_2$ with a film thickness of each $\lambda/4n$ ($\lambda$: incident light wavelength) are formed on almost entire surface of the uppermost layer of the p-type nitride semiconductor layer to make a multilayered membrane, so that the light enclosing effect in the active layer 107 can further be improved.

Further, it is preferable to form a structure in which injected carrier is concentrated in a specified portion to strangulate the electric current since it improves the light emitting efficiency. Practically, a current strangulation layer is formed in the p-type nitride semiconductor layer. By forming the current strangulation layer, the difference of the reflectivity in the crosswise direction against the resonance direction of light could be made larger, that is, to make the reflectivity of the current strangulation layer small, and thereby to further confine the light in the waveguide region. Since the current strangulation layer is formed in the p-type nitride semiconductor layer, the layer is preferable to be composed of an n-type or an i-type nitride semiconductor layer. Further, the current strangulation layer is preferable to be of $Al_xIn_yGa_{1-x-y}N$ ($0<x<1$; $0\leq y<1$, $x+y\leq 1$) and especially effective current strangulation can be achieved by ion implantation of Al or an n-type impurity. Further, in mixed crystal ratio y preferably satisfies $0\leq y<1$, and in such case, the light can be effectively confined. The electric current leakage can be prevented by forming the current strangulation layer in a manner that the lowermost part of the current strangulation layer is set at a position nearer to the active layer than the position at 0.4 $\mu$m (the value equivalent to the emitted light wavelength) above the active layer.

Although the above description is of the surface emitting type laser, the present invention is not limited to such a laser and can be applicable to other light emitting elements if the light emitting elements comprises the multilayered reflective membrane.

Hereinafter, a GaN-based semiconductor laser 2 illustrated in FIG. 1A will be described in details. As the substrate 101, GaN is preferable to be used, however a hetero type substrate differing from a nitride semiconductor may be employed. As the hetero type substrate, for example, sapphire having any of C-plane, R-plane, and A-plane as a main surface, an insulating substrate of such as a spinel ($MgAl_2O_4$), and an oxide substrate having lattice conformation to SiC (including 6H, 4H, and 3C), ZnS, ZnO, GaAs, Si, and a nitride semiconductor and the like are capable of growing nitride semiconductors thereon and have been known well to be usable and thus substrate materials different from the nitride semiconductors can be used. As a preferable hetero type substrate, sapphire and spinel can be exemplified. Further, the hetero type substrate may be subjected to off-angle treatment and in this case, use of those subjected to the off-angle treatment in step-like state well promotes growth of an underlayer of gallium nitride with good crystallinity and therefore, it is preferable. Further, in the case of using the hetero substrate, a nitride semiconductor layer to be an underlayer before element structure formation may be grown on the hetero type substrate and then the hetero type substrate is removed by a method such as polishing or the like to form an element structures a single substrate of the nitride semiconductor or the element structure may be formed and then the hetero type substrate is removed.

In the case of using the hetero type substrate, if the element structure is formed through a buffer layer (a low temperature grown layer) 102 and an underlayer of a nitride semiconductor (preferably GaN, not illustrated), the growth of the nitride semiconductor is carried out excellently. As another underlayer (a grown substrate) to be formed on the hetero type substrate, if a nitride semiconductor grown by ELOG (Epitaxially Laterally Overgrowth) is used, a grown substrate with excellent crystallinity can be obtained. As a specific example of the ELOG grown layer, there is a layer of a nitride semiconductor formed by growing a nitride semiconductor layer on the hetero type substrate, forming mask regions formed by forming a protective film on which the nitride semiconductor layer is difficult to grow and non-mask regions for growing the nitride semiconductor layer in stripe-like patterns, growing the nitride semiconductor layer from the non-mask regions in the film thickness direction and the lateral direction as well so as to grow the layer even beyond the mask regions. In another manner, openings are formed in a nitride semiconductor layer grown on the hetero type substrate and growth is carried out from the side faces of the openings in the lateral direction to form a layer.

A multilayered reflective membrane 98 is formed on the buffer layer (the low temperature grown layer) 102. As described above, the multilayered reflective membrane 98 is composed of an $Al_{0.5}Ga_{0.5}N$ layer 94 and a GaN layer 96 which are alternately deposited and the film thickness of the $Al_{0.5}Ga_{0.5}N$ layer 94 and the film thickness of the GaN layer 96 contained in a pair of the $Al_{0.5}Ga_{0.5}N$ layer 94 and the GaN layer 96 is $\lambda/8n_1$ and $3\lambda/8n_2$, respectively. Further, the multilayered reflective membrane 98 is formed by alternately depositing each 100 layers of the respective layers from the $Al_{0.5}Ga_{0.5}N$ layer 94 at the beginning to the GaN layer 96 at the end.

Figure 4:
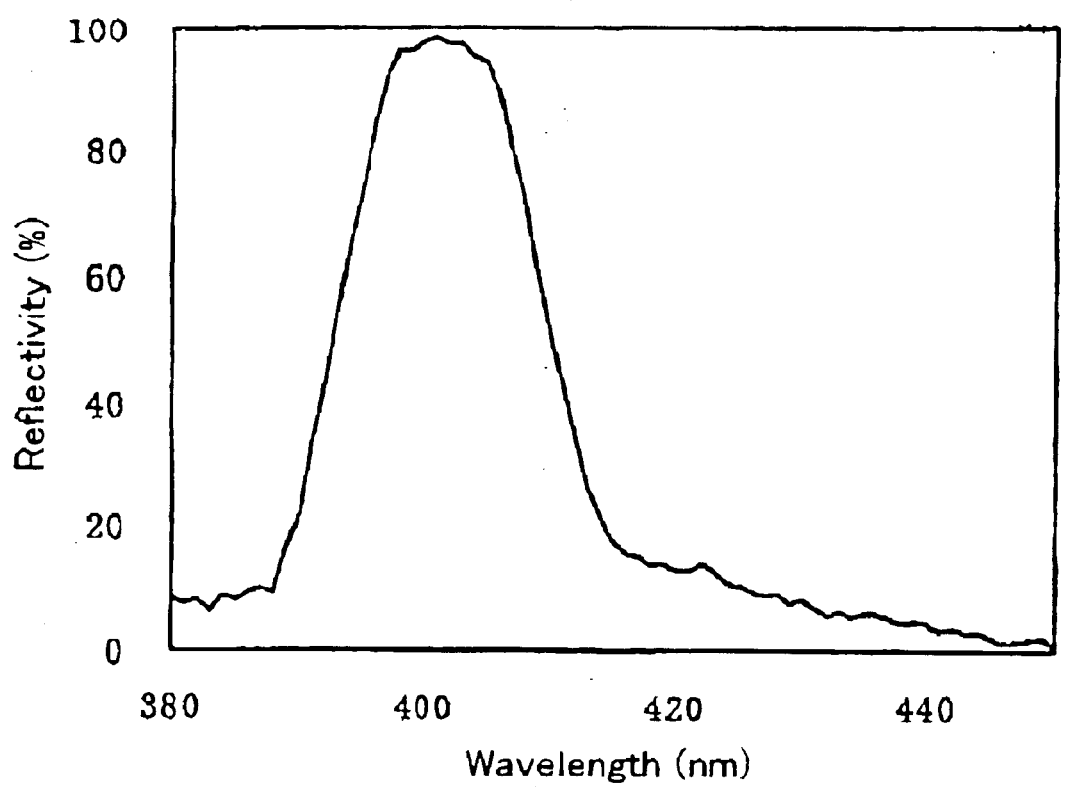
FIG. 4 shows a graph showing the wavelength dependency (the experiment value) of the reflectivity of the multilayered reflective membrane 98 of one embodiment of the invention.

FIG. 4 shows a graph showing the wavelength dependency (the experimental value) of the reflectivity of the multilayered reflective membrane 98 of the present embodiment. As apparent from FIG. 4, the multilayered reflective membrane 98 has a peak value of the reflectivity as extremely high as 97% or higher.

An n-type contact layer 103 of an n-type nitride semiconductor layer, a cracking preventive layer 104, an n-type clad layer 105, and an n-type light guiding layer 106 are formed on the multilayered reflective membrane 98. In the case the n-type contact layer 103 functions also as an electron supply layer, the layers other than the n-type contact layer 103 may be eliminated depending on types of elements. The n-type nitride semiconductor layers are required to have a wider band gap than an active layer in the portion brought into contact with at least the active layer 107, and for that, the layers are preferable to have a composition containing Al. The respective layers may be grown to be n-type while doping with an n-type impurity or may be grown to be n-type with un-doped state.

The active layer 107 is formed on the n-type nitride semiconductor layers 103 to 105. The active layer 107 has a multi-quantum well (MQW) structure formed by depositing, for example, an $In_cGa_{1-c}N$ (0<c<1) well layer and an $In_dGa_{1-d}N$ (0≦d<1, c>d) barrier layer alternately and repeatedly in proper times. Incidentally, the active layer 107 may be a single-quantum well (SQW) structure comprising only a single composition, $In_eGa_{1-e}N$ (0≦e<1).

On the active layer 107, as p-type nitride semiconductor layers, a p-type electron enclosing layer 108, a p-type light guiding layer 109, a p-type clad layer 110, and a p-type contact layer 111 are formed. The layers other than the p-type electron enclosing layer 108 and the p-type contact layer 111 may be eliminated depending on types of elements. The p-type nitride semiconductor layers are required to have a wider band gap than an active layer in the portion brought into contact with at least the active layer, and for that, the layers are preferable to have a composition containing Al. The respective layers may grow to be p-type while doping with a p-type impurity or may be p-type by diffusing the p-type impurity from neighboring other layers.

The p-type electron enclosing layer 108 is of a p-type nitride semiconductor having a higher Al mixed crystal ratio than the p-type clad layer 110 and preferably has a composition of $Al_xGa_{1-x}N$ (0.1<x<0.5). In addition, the layer has a high concentration of the p-type impurity such as Mg and is doped with the impurity in a concentration of $5\times10^{17}/cm^3$ to $1\times10^{19}/cm^3$. Consequently, the p-type electron enclosing layer 108 can efficiently enclose electrons in the active layer to lower the laser threshold value. Further, the p-type electron enclosing layer 108 may be grown in form of a thin film of about 30 to 200 Å and if a thin film, the layer can be grown at a lower temperature than that of the p-type light guiding layer 109 and the p-type clad layer 110. Accordingly, formation of the p-type electron enclosing layer 108 makes it possible to suppress decomposition of the In-containing active layer 107 as compared with the case the p-type light guiding layer 109 or the like is directly formed on the active layer.

Further, protective films 161, 162, a p-type electrode 120, an n-type electrode 121, a p-pad electrode 122, and an n-pad electrode 123 are formed to complete the semiconductor laser element 2.

DESCRIPTION OF THE PREFERRED EXAMPLES

In order to describe the invention more particularly, the invention will be described along with examples.

(First Example)

A laser element of first example will be described with the reference to FIG. 1A.

(Substrate 101)

As a substrate, after a nitride semiconductor, in the present example, GaN, with a film thickness of 100 μm was grown on a hetero type substrate, the hetero type substrate was removed to use a nitride semiconductor substrate of GaN with a thickness of 80 μm. The detailed formation method of the substrate is as follows. A hetero type substrate of sapphire having C-plane as a main surface and 2-inch φ was set in a MOVPE reaction container and the temperature was kept at 500° C. and using trimethyl gallium (TMG) and ammonia ($NH_3$), a buffer layer of GaN with a film thickness of 200 Å was grown and then the temperature was increased and an un-doped GaN with a film thickness of 1.5 μm was grown to form an underlayer. Next, a plurality of stripe-like masks were formed on the surface of the underlayer and a nitride semiconductor, GaN in the present example, was selectively grown from the opening parts (window parts) of the masks and the nitride semiconductor layer formed by the growth (ELOG) accompanied with growth in the lateral direction was further grown in the film thickness and after that, the hetero type substrate, the buffer layer, and the underlayer were removed to obtain a nitride semiconductor substrate. In this case, the masks for the selective growth were made of $SiO_2$ and the width of the masks was set to be 15 μm and the width of the opening parts (window parts) to be 5 μm. Further, in this substrate, in the case of forming the following buffer layer 102, sapphire might be used for the substrate and the buffer layer may be formed directly on the sapphire.

(Buffer Layer 102)

After the buffer layer growth on the nitride semiconductor substrate, the temperature was increased to 1050° C. and using TMG (trimethyl gallium), TMA (trimethyl aluminum), and ammonia, a buffer layer 102 of $Al_{0.05}Ga_{0.95}N$ with a film thickness of 4 μm was grown. The layer would function as a buffer layer between an n-type contact layer of AlGaN and a nitride semiconductor of GaN. Then, on the underlayer of the nitride semiconductor, the respective layers to form an element structure were deposited. Incidentally, these layers might be eliminated.

(Multilayered Reflective Membrane 98)

Successively, at a temperature of 1050° C., using TMA (trimethyl aluminum), TMG, and ammonia, a layer of un-doped $Al_{0.5}Ga_{0.5}N$ with a film thickness of 222 Å was grown and successively while TMA supply being stopped, a layer of un-doped GaN with a film thickness of 600 Å was grown. The above-described un-doped $Al_{0.5}Ga_{0.5}N$ layer and un-doped GaN were alternately deposited to form a superlattice layer and grow a multilayered reflective membrane 98 with a film thickness of 8.22 μm in total and having the superlattice structure.

(n-Type Contact Layer 103)

Next, after formation of the multilayered reflective membrane 98, using TMG, TMA, ammonia, and silane gas as an impurity gas, an n-type contact layer 103 of Si-doped $Al_{0.05}Ga_{0.95}N$ with a film thickness of 4 μm was grown.

(Crack Preventive Layer 104)

Next, using TMG, TMI (trimethyl indium), and ammonia, at a temperature of 800° C., a crack preventive layer 104 of $In_{0.06}Ga_{0.94}N$ with a film thickness of 0.15 μm was grown. Incidentally, the crack preventive layer can be omitted.

(n-Type Clad Layer 105)

A n-type clad layer 105 is not particularly limited if the n-type clad layer has a composition which can increase the band gap energy than that of the active layer 107 and confine the carrier and the light in the active layer. The n-type clad layer is preferably $Al_bGa_{1-b}N(0 \leq b < 0.3)$, and more preferably $0 \leq b < 0.1$. Although the thickness of the n-type clad layer is not particularly limited, it is preferable to select the thickness so that the standing wave exists. Further, although the concentration of the n-type impurity in the n-type clad layer is not particularly limited, the concentration of the n-type impurity is preferably $1 \times 10^{17}/cm^3$ to $1 \times 10^{20}/cm^3$, more preferably $1 \times 10^{18}/cm^3$ to $1 \times 10^{19}/cm^3$. The n-type clad layer may be formed to be a single layer or may be formed to be a superlattice layer.

In order to form the superlattice layer, the n-type clad layer can be formed, for example, according to the following manner. At a temperature of 1050° C., using TMA, TMG, and ammonia, an A layer of un-doped $Al_{0.05}Ga_{0.95}N$ with a film thickness of 25 Å was grown and successively while TMA supply being stopped and silane gas being used as an impurity gas, a B layer of GaN doped with Si in $5 \times 10^{18}/cm^3$ and having a film thickness of 25 Å was grown. These steps were repeated respectively several times to laminate the A layer and the B layer to form an n-type clad layer 106 of a multilayered membrane (superlattice structure). In this case, if the Al mixed crystal ratio of the un-doped AlGaN was within a range of not lower than 0.05 to not higher than 0.3, a sufficient reflectivity difference to function as a clad layer could be obtained.

(n-Type Light Guiding Layer 106)

Next, at the same temperature, using TMG and ammonia as raw material gases, an n-type light guiding layer 106 of un-doped GaN with a film thickness of 0.15 μm was grown. The layer might be doped with an n-type impurity. Incidentally, the layer could be omitted.

(Active Layer 107)

Next, at a temperature of 800° C., using TMI (trimethyl indium), TMG, and ammonia as raw material gases and silane gas as an impurity gas, a barrier layer (B) of $In_{0.05}Ga_{0.95}N$ doped with Si in $5 \times 10^{18}/cm^3$ and having a film thickness of 70 Å was grown and successively while silane gas supply being stopped, a well layer (W) of un-doped $In_{0.1}Ga_{0.9}N$ and having a film thickness of 70 Å was grown. In this case, the barrier layer (B) and the well layer (W) were deposited in the order of (B)/(W)/(B)/(W)/(B)/(W)/(B). The active layer 107 was formed in a multi-quantum well structure (MQW) with a film thickness of 490 Å in total.

(p-Type Electron Enclosing Layer 108)

Next, at the same temperature, using TMA, TMG, and ammonia as raw material gases and $Cp_2Mg$ (cyclopentadienyl magnesium) as an impurity gas, a p-type electron enclosing layer 108 of $Al_{0.3}Ga_{0.7}N$ doped with Mg in $1 \times 10^{19}/cm^3$ and having a film thickness of 100 Å was grown. This layer might be omitted, but if the layer was formed, it could function for enclosing electrons and contribute to decrease of the threshold value.

(p-Type Light Guiding Layer 109)

Next, at the temperature of 1050° C., using TMG and ammonia as raw material gases, a p-type light guiding layer 109 of un-doped GaN having a film thickness of 0.15 μm was grown. The p-type light guiding layer 109 was grown in un-doped state, however it had an Mg concentration of $5 \times 10^{16}/cm^3$ owing to diffusion of Mg from the neighboring layers of such as the p-type electron enclosing layer 108 and the p-type light guiding layer 109. The layer might be doped with Mg intentionally during the growth. It was possible to omit the layer.

(p-Type Clad Layer 110)

A p-type clad layer 110 is not particularly limited if the p-type clad layer has a composition which can increase the band gap energy than that of the active layer 107 and confine the carrier and the light in the active layer. The p-type clad layer is preferably $Al_cGa_{1-c}N(0 \leq c < 0.3)$, and more preferably $0 \leq c < 0.1$. Although the film thickness of the p-type clad layer is not particularly limited, it is preferable to select the film thickness so that the standing wave exists. Further, although the concentration of the p-type impurity in the p-type clad layer is not particularly limited, the concentration of the p-type impurity is preferably $1 \times 10^{18}/cm^3$ to $1 \times 10^{21}/cm^3$, more preferably $1 \times 10^{19}/cm^3$ to $5 \times 10^{20}/cm^3$. If the concentration of the impurity is within the above range, the bulk resistance can be lowered without deteriorating the crystallinity. The p-type clad layer may be formed to be a single layer or may be formed to be a superlattice layer.

In order to form the superlattice layer, the n-type clad layer can be formed, for example, according to the following manner. At a temperature of 1050° C., a layer of un-doped $Al_{0.05}Ga_{0.95}N$ with a film thickness of 25 Å was grown and successively while TMA supply being stopped and $Cp_2Mg$ being used, a layer of GaN doped with Mg and having a film thickness of 25 Å was grown and these steps were repeated several times to form a p-type clad layer 110 of a superlattice layer with a film thickness of 0.45 μm in total. If the p-type clad layer was formed in a superlattice structure formed by depositing nitride semiconductor layers of which at least one contained Al and therefore which had band gap energy different from each other, the crystallinity tended to be excellent by doping either one layer with an impurity more, that is, carrying out so-called modulated doping, however similar doping might be carried out for both. The clad layer 110 was preferable to have a superlattice structure of Al-containing nitride semiconductor layers, preferably of $Al_xGa_{1-x}N$ $(0<x<1)$ and further more preferable to have a superlattice structure of alternately deposited GaN and AlGaN. Since the Al mixed crystal ratio in the entire clad layer could be increased by making the p-type clad layer 110 have the superlattice structure, the reflectivity of the entire clad layer became small and the band gap energy was increased and therefore it was remarkably effective to lower the threshold value. Further, owing to the superlattice structure, pits formed in the clad layer itself were decreased more than those which were not made to be superlattice and accordingly the occurrence of short-circuit could be suppressed. Incidentally, the layer could be omitted.

(p-Type Contact Layer 111)

Finally, at 1050° C., a p-type contact layer 111 of p-type GaN doped with Mg in $1\times10^{20}/cm^3$ and having a film thickness of 150 Å was grown on the p-type clad layer 110. The p-type contact layer 111 could be composed of p-type $In_xAl_yGa_{1-x-y}N$ ($0\leq x$; $0\leq y$; and $x+y\leq 1$) and preferably, if Mg-doped GaN was used, the most preferable ohmic contact with a p-electrode 120 could be obtained. Since the contact layer 111 was a layer to form an electrode therein, it was preferable to have a carrier concentration as high as $1\times10^{17}/cm^3$ or higher. If the concentration was lower than $1\times10^{17}/cm^3$, it tended to become difficult to obtain preferable ohmic contact. Further, if the composition of the contact layer was GaN, a preferable ohmic contact with an electrode material could easily be obtained. On completion of the reaction, in the reaction container, the resulting wafer was annealed at 700° C. in nitrogen atmosphere to make the p-type layer have further lowered resistance.

After nitride semiconductor was grown to laminate the respective layers as described above, the wafer was taken out of the reaction container and some portion of the n-type contact layer 103 was exposed in order to form an n-type electrode 121 as illustrated in FIG. 1A by RIE (reactive ion etching). Next, a p-electrode 120 of Ni/Au was formed on almost entire surface of the p-type contact layer 111 in the uppermost layer and an n-electrode 121 of Ti/Al was formed on the exposed n-type contact layer 103. After n-electrode 121 and p-electrode 120 were formed in the manner as described above, the wafer was divided into chip-like pieces to obtain a laser element 2 with the structure as illustrated in FIG. 1A.

(Second Example)

Figure 5:
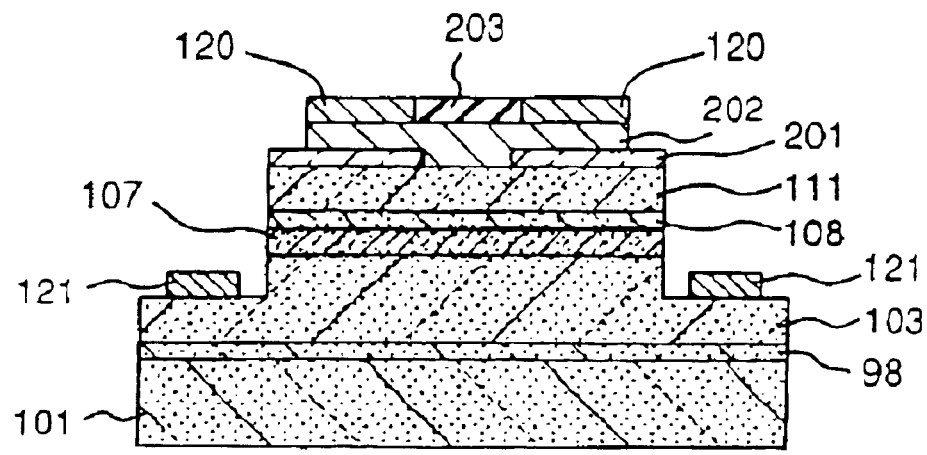
FIG. 5 shows a cross-sectional view of the GaN-based light emitting element according to second example.

Hereinafter, with reference to FIG. 5, a laser element of second example will be described. On a substrate 101, a multilayered reflective membrane 98, an n-type contact layer 103, an active layer 107, a p-type electron enclosing layer 108, and a p-type contact layer 111 were successively deposited in the order. The respective layers were formed respectively similarly to those of first example.

Next, a block layer 201 of $SiO_2$ having circular opening was formed on the p-type contact layer 111 and Ni/Au/ITO (indium tin oxide) were deposited from the circular opening to form a semi-transparent second p-electrode 202. On the second p-electrode 202, a dielectric multilayered film of $SiO_2/TiO_2$ was formed to be a p-side reflective film 203 in a circular shape on the opening part of the block layer 201.

Then, etching was carried out until the n-type contact layer 103 was exposed and a ring-like n-electrode 121 was formed on the exposed n-type contact layer 103 and a p-type electrode 120 surrounding the p-side reflective film 203 was formed on the second p-electrode 202, respectively. Finally, the wafer was divided into chip-like pieces to obtain a laser element as illustrated in FIG. 5. Like the laser element of the present example, formation of a reflective layer in the p-side nitride semiconductor layers made it possible to obtain a surface emitting type laser element with a further high output as compared with that of first example.

(Third Example)

Figure 6:
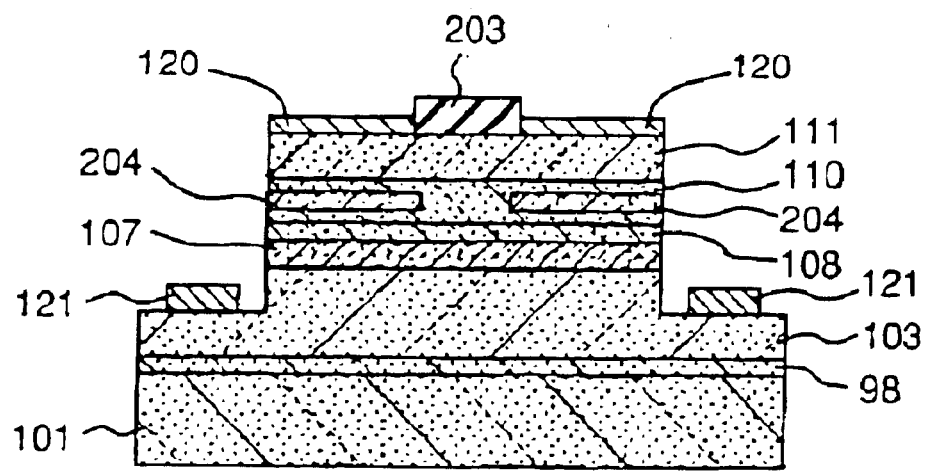
FIG. 6 shows a cross-sectional view of the GaN-based light emitting element according to third example.

Hereinafter, with reference to FIG. 6, a laser element of third example will be described. On a substrate 101, a multilayered reflective membrane 98, an n-type contact layer 103, an active layer 107, and a p-type electron enclosing layer 108 were successively deposited in the order. The respective layers were formed respectively similarly to those of first example. Next, a p-type clad layer 110 of p-type GaN doped with Mg in $1\times10^{20}/cm^3$ and having a film thickness of 0.45 μm was grown and further a p-type contact layer 111 of GaN doped with Mg in $1\times10^{20}/cm^3$ was grown.

After growth of the p-type contact layer 111, the wafer was taken out of the reaction container, a prescribed portion of the n-type contact layer was covered with a mask, for example, with a shape of 10 μm φ and made of Si oxide or resist and using an ion implantation apparatus, ion implantation was carried out to the depth of the lower part of the p-type contact layer from the upper part of the p-type clad layer to form an current strangulation layer 204 having the mask part as an opening part. The depth of the ion implantation could be adjusted by the implantation energy. The elements to be employed for the ion implantation included n-type impurities such as Si, Ge for converting the nitride semiconductors into n-type and Al for widening the band gap energy of the nitride semiconductors, B which is a group III element to increase the resistance of the nitride semiconductors, and p-type impurities such as Be, Zn, and Cd as well as Se, Te and the like belonging to group VI elements for converting the nitride semiconductor into p-type with a high resistance. By the above described method, a current strangulation layer 204 whose lowest part was positioned in the upper part by 0.3 μm (the value equivalent to the emitted light wavelength) from the active layer was formed.

Next, on the surface p-type contact layer 111, Ni/Au/ITO (indium tin oxide) having a circular opening part was formed to form a p-electrode 120 and further, on the opening part of the p-type contact layer 111, a dielectric multilayered film of $SiO_2/TO_2$ was formed to form a p-side reflective film 203. Finally, the wafer was divided into chip-like pieces to obtain a laser element as illustrated in FIG. 6. Like the laser element of the present example, formation of a reflective layer in the p-side nitride semiconductor layers to form the current strangulation structure made it possible to obtain a surface emitting type laser element with a further high output as compared with that of second example.

(Fourth Example)

Figure 7:
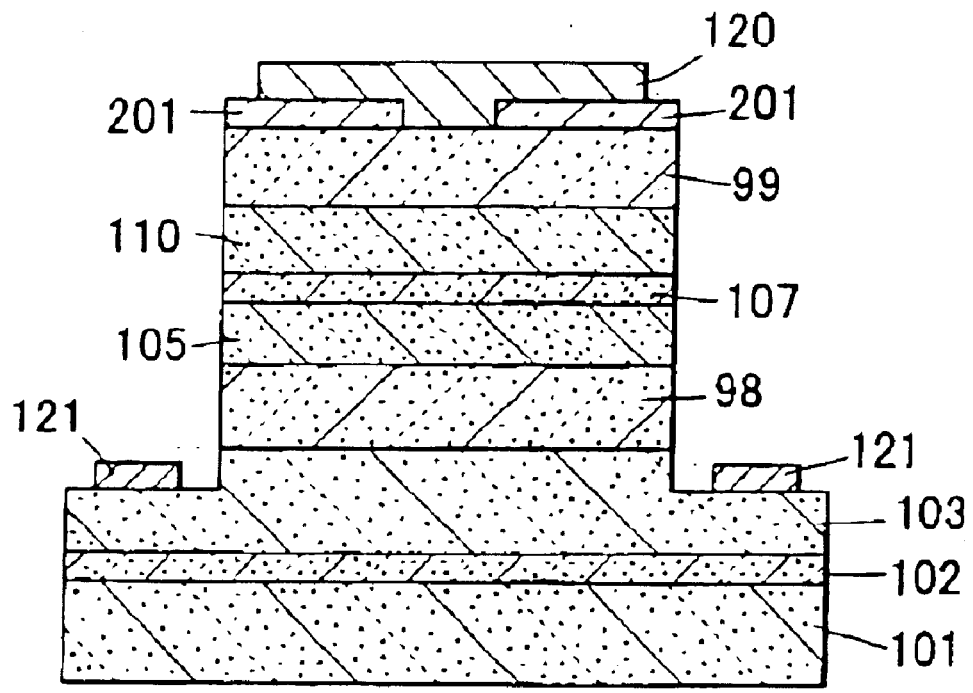
FIG. 7 shows a cross-sectional view of the GaN-based light emitting element according to fourth example.

Hereinafter, with reference to FIG. 7, a laser element of fourth example will be described. On a substrate 101, a buffer layer 102, a n-type contact layer 103, a multilayered reflective membrane 98 (hereinafter referred to as a substrate side multilayered reflective membrane), a single layer of a n-type clad layer 105, an active layer 107, a single layer of a p-type clad layer 110, a light emitting surface side multilayered reflective membrane 99, a block layer having a circular opening, and a p-electrode were successively deposited in the order. The n-type clad layer 105 and the p-type clad layer could be composed of undoped GaN and p-type GaN doped with Mg in $1\times10^{20}/cm^3$, respectively, and could be formed by selecting the thickness so that the standing wave exists. The respective layers except the n-type clad layer 105 and the p-type clad layer 110 were formed respectively similarly to those of first and second examples. Further, the light emitting surface side multilayered reflective membrane 99 was formed similarly to the substrate side multilayered reflective membrane 98. Finally, the wafer was divided into chip-like pieces to obtain a laser element as illustrated in FIG. 7. Like the laser element of the present example, formation of the multilayered reflective membrane on both sides of the active layer made it possible to shorten the resonator length, and thereby to obtain the lower threshold electric current for laser oscillation.

(Fifth Example)

Figure 8:
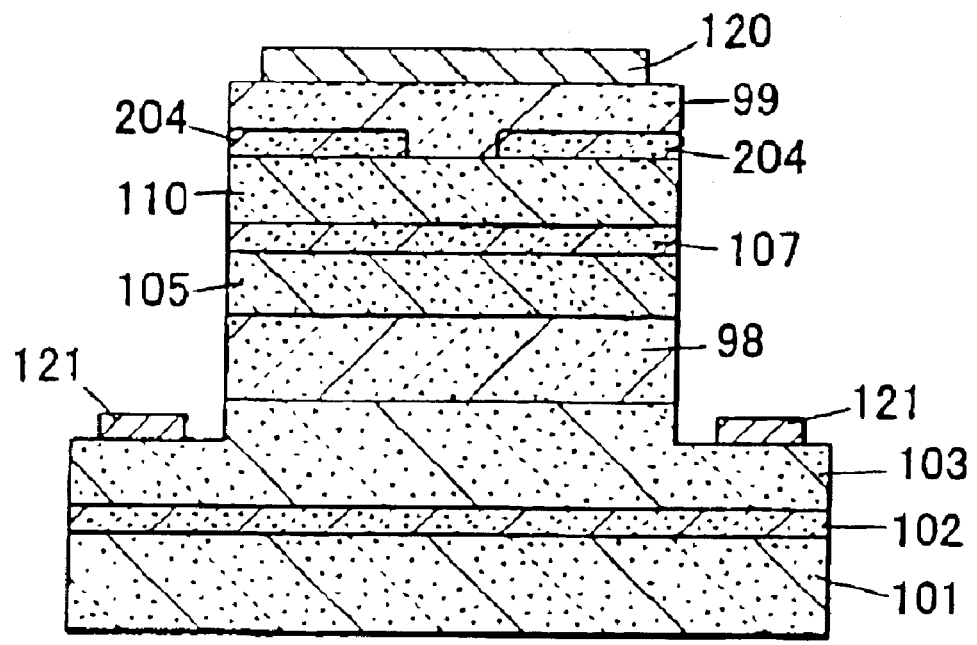
FIG. 8 shows a cross-sectional view of the GaN-based light emitting element according to fifth example.

Hereinafter, with reference to FIG. 8, a laser element of fifth example will be described. On a substrate 101, a buffer layer 102, a n-type contact layer 103, a substrate side multilayered reflective membrane 98, a single layer of a n-type clad layer 105, an active layer 107, and a single layer of a p-type clad layer 110 were successively deposited in the order. The respective layers except the n-type clad layer 105 and the p-type clad layer 110 were formed respectively similarly to those of fourth example. In this example, a current strangulation layer could be composed of $Al_{0.35}In_{0.05}Ga_{0.6}N$, and a light emitting surface side multilayered reflective membrane 99 could be formed after forming the current strangulation layer. Next, p-electrode 120 of Ni/Au was formed on the light emitting surface side multilayered reflective membrane 99. Finally, the wafer was divided into chip-like pieces to obtain a laser element as illustrated in FIG. 8. Like the laser element of the present example, forming the multilayered reflective membrane on both sides of the active layer and also forming the current strangulation structure on the light emitting surface side multilayered reflective membrane 99 made it possible to concentrate the current in the high reflective region to inject the current effectively and also to confine the light effectively, and thereby to obtain the lower threshold electric current for laser oscillation.

(Sixth Example)

Figure 9:
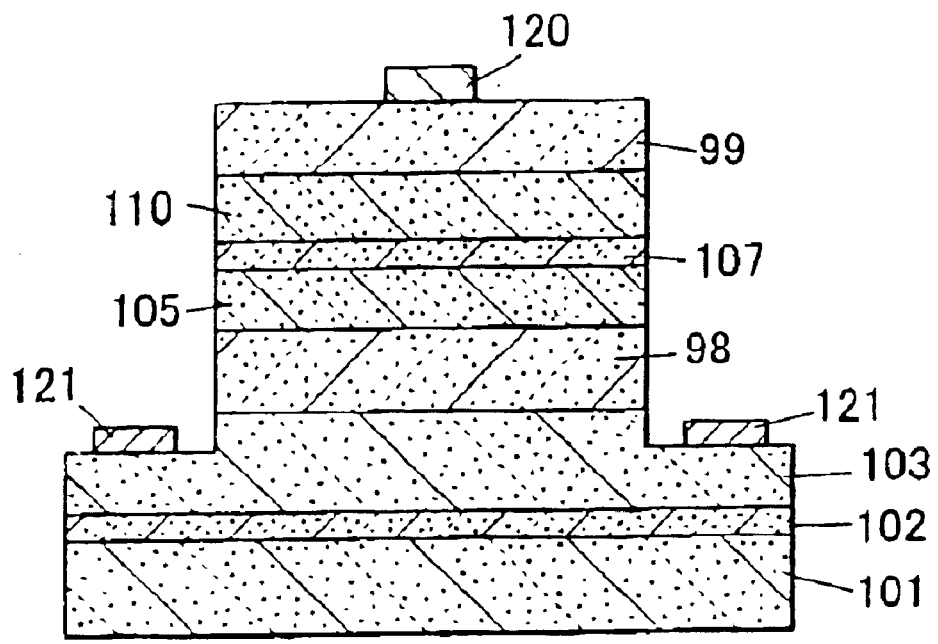
FIG. 9 shows a cross-sectional view of the GaN-based light emitting element according to sixth example.

Hereinafter, with reference to FIG. 9, a laser element of sixth example will be described. On a substrate 101, a buffer layer 102, a n-type contact layer 103, a substrate side multilayered reflective membrane 98, a single layer of a n-type clad layer 105, an active layer 107, a single layer of a p-type clad layer 110, and a light emitting surface side multilayered reflective membrane 99 were successively deposited in the order. The respective layers except the n-type clad layer 105 and the p-type clad layer 110 were formed respectively similarly to those of fourth example. Next, p-electrode 120 of Ni/Au was formed on a center portion of the surface of the light emitting surface side multilayered reflective membrane 99. Finally, the wafer was divided into chip-like pieces to obtain a laser element as illustrated in FIG. 9. Like the laser element of the present example, forming the p-electrode on the portion of the multilayered reflective membrane so as to contact directly made it possible for the current to flow just below the p-electrode to form a waveguide region. Therefore, the length of the resonator can be shortened and the current strangulation layer can be omitted, and thereby to obtain the lower threshold electric current for laser oscillation.

(Seventh Example)

Figure 10:
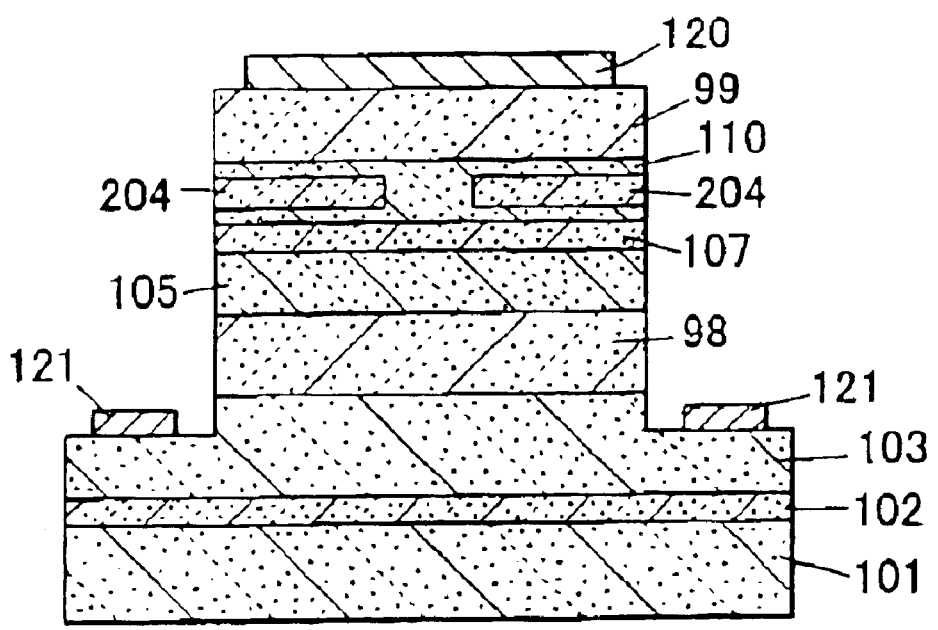
FIG. 10 shows a cross-sectional view of the GaN-based light emitting element according to seventh example.

Hereinafter, with reference to FIG. 10, a laser element of seventh example will be described. On a substrate 101, a buffer layer 102, a n-type contact layer 103, a substrate side multilayered reflective membrane 98, a single layer of a n-type clad layer 105, an active layer 107, and a single layer of a p-type clad layer 110 were successively deposited in the order. The respective layers except the n-type clad layer 105 and the p-type clad layer 110 were formed respectively similarly to those of fourth example. Next, a light emitting surface side multilayered reflective membrane 99 was deposited on the p-type clad layer 110, and then a current strangulation layer 204 was formed similarly to those of the third example. Next, p-electrode 120 of Ni/Au was formed on the light emitting surface side multilayered reflective membrane 99. Finally, the wafer was divided into chip-like pieces to obtain a laser element as illustrated in FIG. 10. Like the laser element of the present example, forming the current strangulation layer between the light emitting surface side multilayered reflective membrane and the active layer made it possible for the current to concentrate in the high reflective region to make the current injection effectively. Furthermore, since the difference of the reflectivity in the resonator can be increased to confine the light effectively, and thereby to obtain the lower threshold electric current for laser oscillation.

(Eighth Example)

Figure 11:
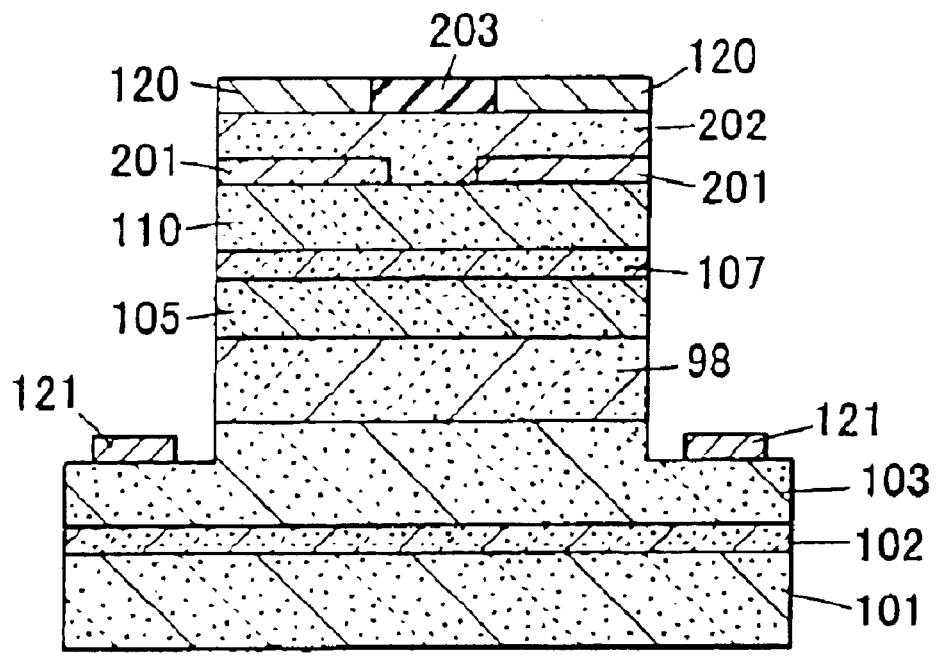
FIG. 11 shows a cross-sectional view of the GaN-based light emitting element according to eighth example.

Hereinafter, with reference to FIG. 11, a laser element of eighth example will be described. On a substrate 101, a buffer layer 102, a n-type contact layer 103, a substrate side multilayered reflective membrane 98, a superlattice layer of a n-type clad layer 105, an active layer 107, and a single layer of a p-type clad layer 110, a block layer 201 having a circular opening part, a semi-transparent second p-electrode 202, a p-side reflective film 203 composed of a dielectric multilayered film of $SiO_2/TiO_2$ and having a circular opening part, and a p-electrode 120 surrounding the p-side reflective film were successively deposited in the order. The respective layers were formed respectively similarly to those of the first and the third examples. Finally, the wafer was divided into chip-like pieces to obtain a laser element as illustrated in FIG. 11. Like the laser element of the present example, forming at least one of the n-type clad layer and the p-type clad layer to be the superlattice structure made it possible to increase the carrier mobility to inject the carrier effectively into the active layer, and thereby to further lower the threshold electric current for laser oscillation.

(Ninth Example)

Figure 12:
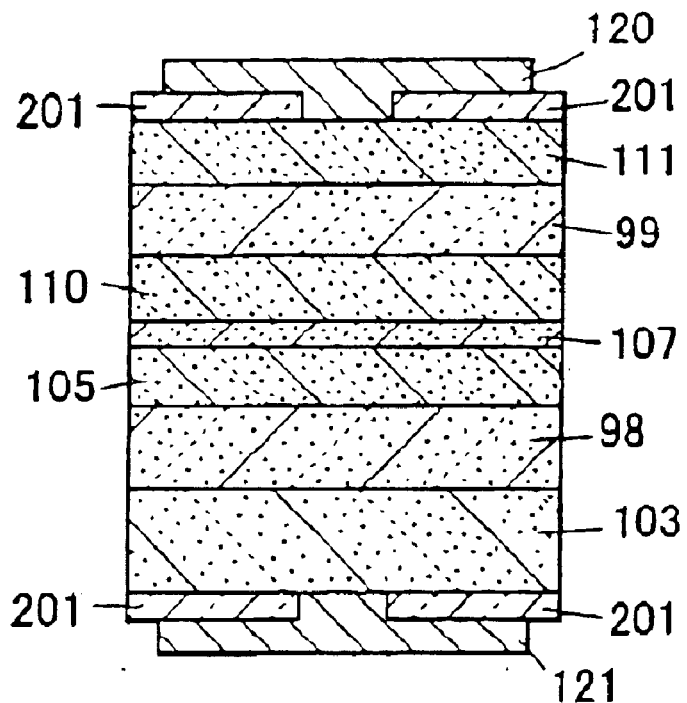
FIG. 12 shows a cross-sectional view of the GaN-based light emitting element according to ninth example.
Figure 13:
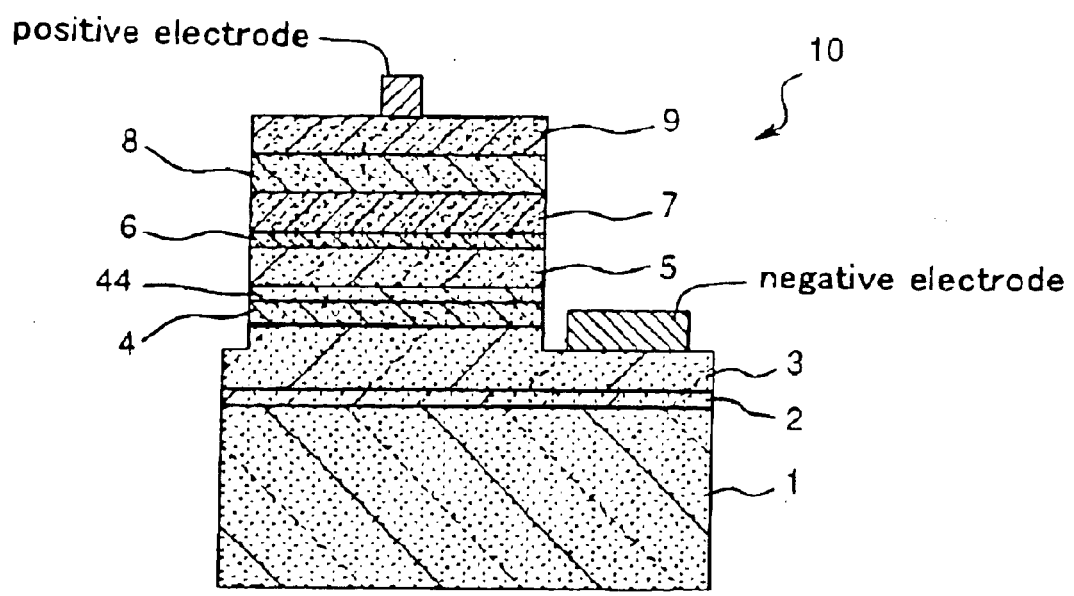
FIG. 13 shows A schematic cross-sectional view of a conventional laser element.

Hereinafter, with reference to FIG. 12, a laser element of ninth example will be described. On a substrate 101, a buffer layer 102, a n-type contact layer 103, a substrate side multilayered reflective membrane 98, a superlattice layer of a n-type clad layer 105, an active layer 107, and a superlattice layer of a p-type clad layer 110, the light emitting surface side multilayered reflective membrane 99, p-type contact layer 111, a block layer 201 having a circular opening part, and a p-electrode 120 were successively deposited in the order. The respective layers were formed respectively similarly to those of the first and the second examples. Next, the substrate 101 and the buffer layer 102 were separated by the laser irradiation and removed to expose the n-type contact layer 103. Next, a block layer 201 having a circular opening part and the p-electrode were deposited on the exposed n-type contact layer 103 in the order. Finally, the wafer was divided into chip-like pieces to obtain a laser element as illustrated in FIG. 12. Like the laser element of the present example, forming a configuration in which the p-type electrode and the n-type electrode oppose each other, that is the electrodes sited at the top and bottom of the element, made it possible to obtain the uniform current distribution as compared with a configuration in which the p-type electrode and the n-type electrode are plainly positioned, thereby suppressing a heat generation of the element. Further, since the block layer was formed at the n-electrode side, an injection efficiency of the carrier into the active layer can be improved.

As described above, a multilayered reflective membrane of the present invention is characterized in that the membrane is composed of an $Al_aGa_{1-a}N$ layer (0<a<1) having a thickness of $(\alpha_1 \cdot \lambda)/(4n_1)$ ($\lambda$: incident light wavelength, $n_1$: index of refraction) and a GaN layer having a thickness of $(\alpha_2 \cdot \lambda)/(4n_2)$ ($n_2$: index of refraction) which are deposited alternately and satisfy the relationship of $0<\alpha_1<1$ and $\alpha_1+\alpha_2=2$. Accordingly, while keeping $\alpha_1+\alpha_2=2$ as it is before, $\alpha_1$ is kept less than 1 to make the film thickness of the $Al_aGa_{1-a}N$ layer thinner than the conventional value $\lambda/4n_1$, so that a multilayered reflective membrane with an excellent crystallinity while keeping a high reflectivity can be obtained. Further, since the $Al_aGa_{1-a}N$ layer is made thinner than before, even if the Al mixed crystal ratio a is made relatively high, the crystallinity deterioration can be suppressed and a multilayered reflective membrane with a high reflectivity can be obtained.

Although the present invention has been fully described by way of examples with references to the accompanying drawings, it is to be noted here that various changes and modifications will be apparent to those skilled in the art.

Therefore, unless such changes and modifications otherwise depart from the spirit and scope of the present invention, they should be constructed as being included therein.

What is claimed is:

1. A multilayered reflective membrane for a light emitting element containing an active layer comprising:

an $Al_aGa_{1-a}N$ layer (0<a<1) having a thickness of $(\alpha_1 \cdot \lambda)/(4n_1)$, wherein $\lambda$ is a wavelength of incident light from the active layer and $n_1$ is a first refractive index;

a GaN layer having a thickness of $(\alpha_2 \cdot \lambda)/(4n_2)$, wherein $n_2$ is a second refractive index; and wherein the $Al_aGa_{1-a}N$ layer and the GaN layer are deposited alternately and satisfy $0<\alpha_1<1$ and $\alpha_1+\alpha_2=2$.

2. The multilayered reflective membrane according to claim 1, wherein a Al mixed crystal ratio a of the $Al_aGa_{1-a}N$ layer has a value of between 0.2 to 0.8.

3. The multilayered reflective membrane according to claim 2, wherein the Al mixed crystal ratio a of the $Al_aGa_{1-a}N$ layer has a value of between 0.3 to 0.7.

4. The multilayered reflective membrane according to claim 1, wherein $\alpha_1$ has a value of not greater than 0.75.

5. The multilayered reflective membrane according to claim 4, wherein $\alpha_1$ has a value of not greater than 0.5.

6. A gallium nitride based light emitting element comprising:

a multilayered reflective membrane;

an active layer;

a nitride semiconductor layer extending between the multilayered reflective membrane and the active layer;

wherein the multilayered reflective membrane comprises:

an $Al_aGa_{1-a}N$ layer (0<a<1) having a thickness of $(\alpha_1 \cdot \lambda)/(4n_1)$, wherein $\lambda$ is a wavelength of incident light from the active layer and $n_1$ is a first refractive index;

a GaN layer having a thickness of $(\alpha_2 \cdot \lambda)/(4n_2)$, wherein $n_2$ a second refractive index; and wherein the $Al_aGa_{1-a}N$ layer and the GaN layer are deposited alternately and satisfy $0<\alpha_1<1$ and $\alpha_1+\alpha_2=2$.

7. The light emitting element according to claim 6, wherein the multilayered reflective membrane is formed between the substrate and the active layer.

8. The light emitting element according to claim 7, wherein the nitride semiconductor layer comprises a clad layer.

9. The light emitting element according to claim 6, wherein the nitride semiconductor layer is a superlattice layer.

10. The light emitting element according to claim 9, wherein the superlattice layer is formed so as to contact directly with the multilayered reflective membrane.

11. The light emitting element according to claim 9, wherein the superlattice layer is formed so as to contact directly the active layer.

12. The light emitting element according to claim 6, wherein a Al mixed crystal ratio a of the $Al_aGa_{1-a}N$ layer has a value of between 0.2 to 0.8.

13. The light emitting element according to claim 12, wherein the Al mixed crystal ratio a of the $Al_aGa_{1-a}N$ layer has a value of between 0.3 to 0.7.

14. The light emitting element according to claim 6, wherein $\alpha_1$ has a value of not greater than 0.75.

15. The light emitting element according to claim 14, wherein $\alpha_1$ has a value of not greater than 0.5.

16. The light emitting element according to claim 6, wherein the light emitting element is a surface emitting type laser element which emits light in the perpendicular direction to the main surface of the substrate.

* * * * *